(12) United States Patent
Hong et al.

(10) Patent No.: US 9,371,234 B2
(45) Date of Patent: Jun. 21, 2016

(54) METHOD FOR PRODUCING GRAPHENE AT A LOW TEMPERATURE, METHOD FOR DIRECT TRANSFER OF GRAPHENE USING SAME, AND GRAPHENE SHEET

(75) Inventors: Byung Hee Hong, Seoul (KR); Jong-Hyun Ahn, Suwon-si (KR); Ji Beom Yoo, Suwon-si (KR); Su Kang Bae, Suwon-si (KR); Myung Hee Jung, Suwon-si (KR); Houk Jang, Suwon-si (KR); Youngbin Lee, Suwon-si (KR); Sang Jin Kim, Suwon-si (KR)

(73) Assignees: Graphene Square, Inc., Seoul (KR); Hanwha Techwin Co., Ltd., Changwon-si (KR)

(*) Notice: Subject to any disclaimer, the term of this patent is extended or adjusted under 35 U.S.C. 154(b) by 473 days.

(21) Appl. No.: 13/810,144

(22) PCT Filed: Jul. 15, 2011

(86) PCT No.: PCT/KR2011/005213
§ 371 (c)(1),
(2), (4) Date: Mar. 22, 2013

(87) PCT Pub. No.: WO2012/008789
PCT Pub. Date: Jan. 19, 2012

(65) Prior Publication Data
US 2013/0187097 A1    Jul. 25, 2013

(30) Foreign Application Priority Data
Jul. 15, 2010    (KR) .................. 10-2010-0068634

(51) Int. Cl.
*H01B 1/04*    (2006.01)
*C01B 31/04*    (2006.01)
(Continued)

(52) U.S. Cl.
CPC ............ *C01B 31/0453* (2013.01); *B82Y 30/00* (2013.01); *B82Y 40/00* (2013.01); *C23C 16/01* (2013.01); *C23C 16/26* (2013.01)

(58) Field of Classification Search
CPC ...... H01B 1/04; C01B 31/0453; B82Y 30/00; B82Y 40/00
USPC ............. 252/500–519.1; 423/448; 427/249.1, 427/249.6, 255.28; 977/734, 842, 890
See application file for complete search history.

(56) References Cited

U.S. PATENT DOCUMENTS

2005/0081983 A1* 4/2005 Nakayama et al. ........... 156/230
2009/0011204 A1* 1/2009 Wang et al. .................. 428/215
(Continued)

FOREIGN PATENT DOCUMENTS

CN    101423209 A    5/2009
JP    2004-030926 A    1/2004
(Continued)

OTHER PUBLICATIONS

Wang et al. ("Synthesis of Carbon Nanosheets by Inductively Coupled Radio-frequency Plasma Enhanced Chemical Vapor Deposition." Carbon, 42, p. 2867-2872, online Aug. 14, 2004).*
(Continued)

*Primary Examiner* — Tri V Nguyen
(74) *Attorney, Agent, or Firm* — Greer, Burns & Crain, Ltd.

(57) ABSTRACT

The present invention relates to a method for forming graphene at a low temperature, to a method for direct transfer of graphene using same, and to a graphene sheet. The method for forming graphene at a low temperature comprises supplying a carbon-source-containing gas to a metal catalyst layer for graphene growth formed on a substrate, and forming graphene at a low temperature of 500° C. or less by means of inductively coupled plasma-chemical vapor deposition (ICP-CVD).

9 Claims, 18 Drawing Sheets

(51) Int. Cl.
*B82Y 30/00* (2011.01)
*B82Y 40/00* (2011.01)
*C23C 16/01* (2006.01)
*C23C 16/26* (2006.01)

(56) References Cited

U.S. PATENT DOCUMENTS

| | | | | |
|---|---|---|---|---|
| 2009/0110627 | A1* | 4/2009 | Choi et al. | 423/447.1 |
| 2010/0297435 | A1* | 11/2010 | Kaul et al. | 428/332 |
| 2011/0100951 | A1* | 5/2011 | Juang et al. | 216/13 |
| 2011/0163289 | A1* | 7/2011 | Zhu | 257/9 |

FOREIGN PATENT DOCUMENTS

| | | |
|---|---|---|
| JP | 2009-091174 | 4/2009 |
| JP | 2009-091174 A | 4/2009 |
| KR | 10-2009-0026568 | 3/2009 |
| KR | 10-2009-0043418 | 5/2009 |
| KR | 10-2009-0065206 | 6/2009 |
| KR | 10-2009-0129176 | 12/2009 |
| KR | 10-2010-0046633 | 5/2010 |

OTHER PUBLICATIONS

Honda et al. ("Low Temperature Synthesis of Aligned Carbon Nanotubes by Inductively Coupled Plasma Chemical Vapor Deposition Using Pure Methane." Jap Soc App Phys, 2(48), pp. 441-443, Apr. 15, 2003).*

Office action issued in Chinese App. No. 201180044473.6 mailed Mar. 23, 2015 (with translation).

K. D. Mackenzie et al., "Inductively-Coupled Plasma Deposition of Low Temperature Silicon Dioxide and Silicon Nitride Films for III-V Applications", Proc. Symp. 30$^{th}$ State-of-the-Art Program on Compound Semiconductors, May 31, 1999.

Sukang Bae et al.; Roll-to-roll production of 30-inch graphene films for transparent electrodes; Nature Nanotechnology, vol. 5; pp. 574-578; Aug. 2010.

Mineo Hiramatsu et al.; "Fabrication of Carbon Nanowalls Using Plasma-Enhanced Chemical Vapor Deposition"; J.Vac. Soc. Jpn. vol. 49, No. 6; 2006.

Tomohide Takami et al., "Catalyst-Free Growth of Networked Nanographite on Si and $SiO_2$ Substrates by Photoemission-Assisted Plasma-Enhanced Chemical Vapor Deposition"; e-Journal of Surface Science and Nanotechnology, vol. 7 (2009) pp. 882-890.

Office Action for Chinese App. No. 201180044473.6 mailed Jul. 1, 2014 (with translation).

Helin Cao et al., "Electronic transport in chemical vapor deposited graphene synthesized on Cu: Quantum Hall effect and weak localization", Applied Physics Letters 2010, vol. 96, p. 122106.

International Search Report issued Jan. 19, 2012 in counterpart International Application No. PCT/KR2011/005213 (6 pages, in Korean with English translation).

* cited by examiner

METHOD FOR PRODUCING GRAPHENE AT A LOW TEMPERATURE, METHOD FOR DIRECT TRANSFER OF GRAPHENE USING SAME, AND GRAPHENE SHEET

CROSS REFERENCE TO RELATED APPLICATIONS

This application is a national stage of International Application No. PCT/KR2011/005213 filed Jul. 15, 2011, claiming priority based on Korean Patent Application No. 10-2010-0068634 filed Jul. 15, 2010, in the Korean Intellectual Patent Office, the disclosures of all of which are incorporated herein by reference for all purposes in their entity.

TECHNICAL FIELD

The present invention relates to a producing method of graphene at a low temperature using inductively coupled plasma-chemical vapor deposition (ICP-CVD), a method for direct transfer of graphene using the same, and a graphene sheet.

BACKGROUND ART

Fullerene, carbon nanotubes, graphene, graphite, and the like are low-dimensional nano-materials composed of carbon atoms. That is, carbon atoms arranged in a hexagonal shape may form zero-dimensional fullerene formed of a ball, may form carbon nanotubes one-dimensionally rolled, may form graphene of a two-dimensional monolayer, and may form graphite three-dimensionally stacked.

In particular, graphene has very stable and excellent electrical, mechanical, and chemical characteristics and is a very excellent conductive material in which electrons can move about 100 times faster than in silicon and current flows about 100 times more than in copper. This was demonstrated through experiments in 2004 when a method of separating graphene from graphite was found. Since then, a great deal of research on this matter has been carried out.

Graphene is made of pure carbons which are relatively light atoms, and, thus, it is very easy to process graphene in a one-dimensional or two-dimensional nano pattern. With this feature, it is possible to control semiconductive and conductive properties and also possible to manufacture widespread functional devices including sensors, memories, etc., using various chemical bonds of carbon.

Despite excellent electrical, mechanical, and chemical characteristics of graphene described above, a research of a practically applicable technology has been limited since a mass production method of graphene has not been developed. In a conventional mass production method, graphite is ground mechanically and dispersed in a solution and a thin film is formed by means of a self-assembly phenomenon. Although graphene can be produced at a relatively low cost by the conventional method, electrical and mechanical characteristics cannot meet the expectations due to a graphene structure in which numerous graphene pieces are overlapped and connected with each other.

Due to a recent surge in demand for flat panel displays, a global transparent electrode market is expected to grow to about twenty trillion won within about 10 years. With development of a display industry in Korea, a domestic demand for transparent electrodes reaches hundreds of billions of wons every year. However, due to a lack of source technologies, Korea depends heavily on imports for transparent electrodes. An ITO (Indium Tin Oxide) as a representative transparent electrode is widely applied to a display, a touch screen, a solar cell, and the like. However, recently, a lack of indium has contributed to an increase in cost, and, thus, there has been an urgent need to develop a substitute substance. Further, due to fragility of the ITO, there has been a limit in applications of the ITO to next-generation electronic devices which is foldable, bendable, and extendable. On the contrary, graphene has been expected to have excellent elasticity, flexibility, and transparency and also expected to be produced and patterned by a relatively simple method. It is anticipated that a graphene electrode has a great import substitution effect if a mass production technology thereof can be established hereafter and also has an innovative ripple effect on the whole technologies in a next-generation flexible electronic industry.

However, due to lack of a method for effective synthesis, transfer, and doping, quality and a scale required to actually produce a graphene film have been restricted. By way of example, a conventional transparent electrode, such as an ITO, generally used for a solar cell exhibits unlimited scalability, optical transparency of about 90%, and sheet resistance of less than about 100 Ohm/square, whereas, the graphene film still shows the highest records of sheet resistance of about 500 Ohm/square, transparency of up to about 90%, and a scale of several centimeters. Korean Patent Laid-open Publication No. 2009-0026568 describes a method in which a polymer is coated on a graphitization catalyst and heat-processed to polymerize graphene, but this method needs to be performed at a high temperature of about 500° C. or more. Therefore, there has been a demand for development of a technique for readily producing graphene at a low temperature.

DISCLOSURE OF THE INVENTION

Problems to Be Solved by the Invention

In order to solve the problems, a method for readily producing graphene at a low temperature of about 500° C. or less using inductively coupled plasma-chemical vapor deposition (ICP-CVD) has been found and the present invention has been completed based on the finding.

Therefore, the present invention provides a producing method of graphene at a low temperature using ICP-CVD, a method for direct transfer of graphene using the same, and a graphene sheet. Further, the present invention provides a producing method of graphene at a low temperature using ICP-CVD is carried out by a roll-to-roll process and a method for direct transfer of graphene using the same.

However, problems to be solved by the present invention are not limited to the above-described problems. Although not described herein, other problems to be solved by the present invention can be clearly understood by those skilled in the art from the following description.

Means for Solving the Problems

In accordance with a first aspect of the present invention, there is provided a producing method of graphene comprising supplying a carbon source-containing gas to a substrate, and producing graphene at a low temperature of about 500° C. or less by inductively coupled plasma-chemical vapor deposition (ICP-CVD). In accordance with an illustrative embodiment, the producing method of graphene may be carried out by using, but may not be limited to, a roll-to-roll process. In accordance with an illustrative embodiment, a metal catalyst layer for growing graphene may be further formed on the substrate, but the present invention may not be limited thereto.

In accordance with a second aspect of the present invention, there is provided a method for direct transfer of graphene, comprising producing graphene on a metal catalyst layer for growing graphene formed on a substrate, and removing the metal catalyst layer for growing graphene to directly transfer the produced graphene on the substrate.

In accordance with a third aspect of the present invention, there is provided a graphene sheet comprising a substrate and graphene produced on the substrate. In accordance with an illustrative embodiment, the graphene may be produced by, but may not be limited to, a method in accordance with the first aspect of the present invention. In accordance with an illustrative embodiment, the graphene sheet may be formed by, but may not be limited to, a method for direct transfer of graphene in accordance with the second aspect of the present invention.

Effect of the Invention

In accordance with the present invention, a graphene sheet can be readily produced on a substrate or a metal catalyst layer for growing graphene produced on the substrate at a low temperature of about 500° C. or less using ICP-CVD. Further, since the graphene sheet producing method can be carried out by a roll-to-roll process, graphene of a large area can be readily produced by a continuous process at a low temperature. The substrate which is difficult to be used at a high temperature can be safely used in the present invention. The method in accordance with the present invention can be applied to various substrates having transparency and/or flexibility. A graphene sheet can be readily produced on, particularly, a glass substrate or a polymer substrate at a low temperature. Further, in case of using a polymer sheet substrate or a substrate on which a polymer sheet is formed in the graphene sheet forming method in accordance with the present invention, a graphene sheet formed by this method can be simply and directly transferred onto the substrate, and, thus, a graphene film can be directly transferred onto the substrate without additional processes.

The method for producing a graphene sheet at a low temperature using ICP-CVD, the method for direct transfer of graphene using the same, and the graphene sheet in accordance with the present invention can be applied to various electric/electronic devices.

BEST MODE FOR CARRYING OUT THE INVENTION

Figure 1:
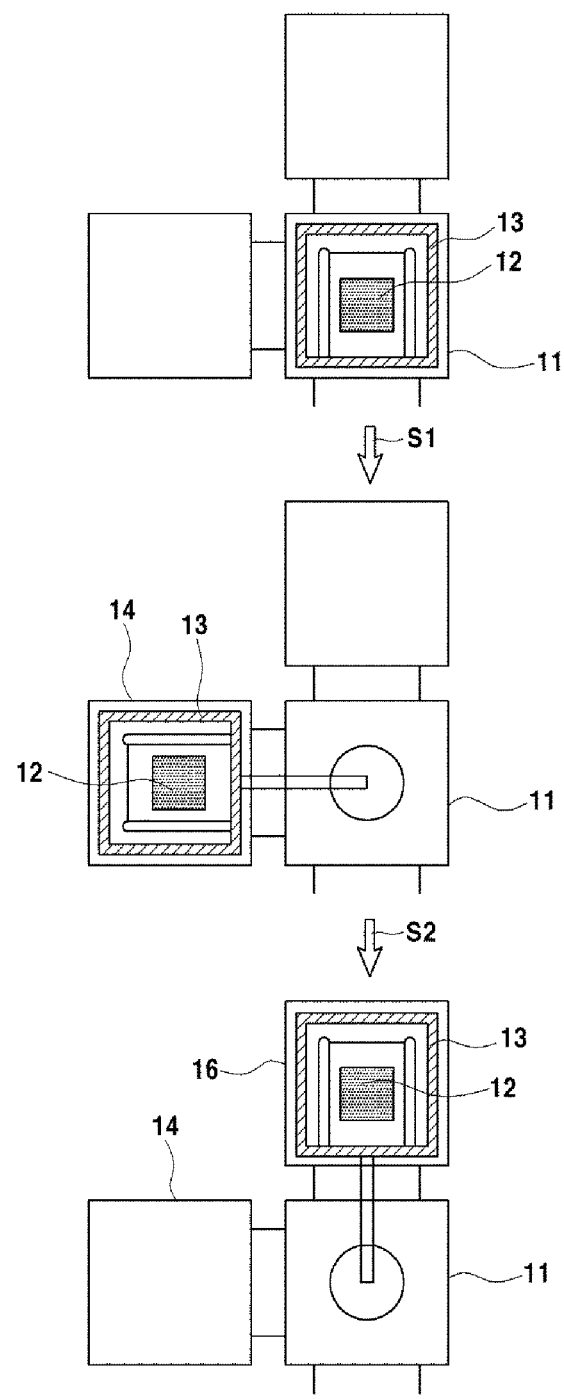
FIG. 1 illustrates an apparatus for producing graphene in accordance with an illustrative embodiment of the present invention.

Hereinafter, illustrative embodiments and examples of the present invention will be described in detail with reference to the accompanying drawings so that the present invention may be readily implemented by those skilled in the art.

However, it is to be noted that the present invention is not limited to the illustrative embodiments and examples but can be embodied in various other ways. In drawings, parts irrelevant to the description are omitted for the simplicity of explanation, and like reference numerals denote like parts through the whole document.

Further, the term "comprises or includes" and/or "comprising or including" used in the document means that one or more other components, steps, operation and/or existence or addition of elements are not excluded in addition to the described components, steps, operation and/or elements unless context dictates otherwise.

The term "about or approximately" or "substantially" are intended to have meanings close to numerical values or ranges specified with an allowable error and intended to prevent accurate or absolute numerical values disclosed for understanding of the present disclosure from being illegally or unfairly used by any unconscionable third party.

Through the whole document, the term "step of" does not mean "step for". Through the whole document, the term "on"

that is used to designate a position of one element with respect to another element includes both a case that the one element is adjacent to the another element and a case that any other element exists between these two elements.

The term "graphene sheet" means sheet-shaped graphene in which numerous carbon atoms are joined together with a covalent bond to form a polycyclic aromatic molecule and the multiple carbon atoms joined together with a multiple covalent bond have a six-membered ring as a fundamental repeat unit and may further include a five-membered ring and/or a seven-membered ring. Therefore, the graphene sheet looks like a monolayer of covalent carbon atoms (typically, $sp^2$ bonding). The sheet may have various structures and these structures may depend on a five-membered ring content and/or a seven-membered ring content of graphene. As described above, the graphene sheet may be formed of a monolayer of graphene and can be formed of multiple stacked layers. Typically, a side end of the graphene may be saturated with hydrogen atoms.

The term "inductively coupled plasma-chemical vapor deposition (ICP-CVD)" will be referred to as "ICP-CVD" below.

In accordance with a first aspect of the present invention, there is provided a producing method of graphene comprising supplying a carbon source-containing gas to a substrate, and producing graphene at a low temperature of about 500° C. or less by ICP-CVD.

In accordance with an illustrative embodiment, the graphene producing method may be carried out by, but may not be limited to, a roll-to-roll process.

In accordance with an illustrative embodiment, the producing method of graphene comprises a step of loading the substrate into an ICP-CVD chamber and supplying the carbon source to produce graphene at a low temperature by the ICP-CVD. The substrate may be loaded in sequence into the ICP-CVD chamber by using a load-locked chamber, but the present invention may not be limited thereto.

In accordance with an illustrative embodiment, a metal catalyst layer for growing graphene may be further formed on the substrate, but the present invention may not be limited thereto.

In accordance with an illustrative embodiment, the producing method of graphene comprises a step of forming the metal catalyst layer for growing graphene on the substrate by loading the substrate into a deposition chamber, and a step of loading the substrate into the ICP-CVD chamber and supplying the carbon source to produce graphene at a low temperature by the ICP-CVD. The substrate may be loaded in sequence into the deposition chamber and the ICP-CVD chamber by using a load-locked chamber, but the present invention may not be limited thereto.

Figure 2:
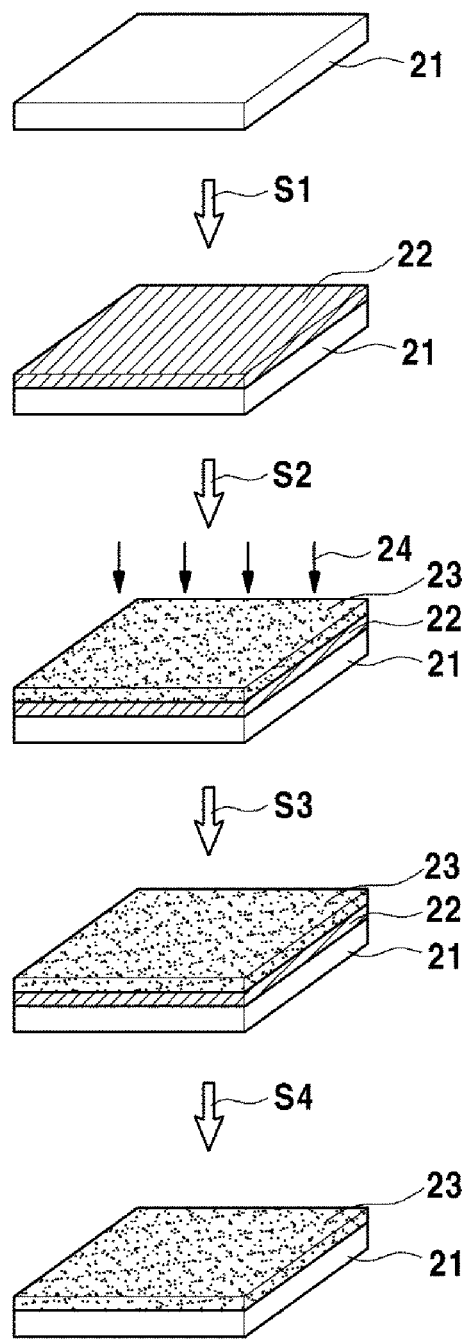
FIG. 2 illustrates a method for producing graphene and a method for transfer of graphene in accordance with an illustrative embodiment of the present invention.

FIG. 1 and FIG. 2 respectively illustrate an apparatus for producing graphene in accordance with an illustrative embodiment of the present invention and a method for producing graphene in accordance with an illustrative embodiment of the present invention.

The producing method of graphene in accordance with an illustrative embodiment of the present invention may be performed by using, but may not be limited to, the graphene producing apparatus of graphene of FIG. 1. The graphene producing apparatus of FIG. 1 may include a transfer chamber 11, a specimen 12, a load-locked chamber 13, a deposition chamber 14, and an ICP-CVD chamber 15. In the deposition chamber 14, a metal catalyst layer for growing graphene is formed on a substrate. In the ICP-CVD chamber 15, a carbon source is supplied to a substrate or the substrate on which the metal catalyst layer for growing graphene is formed in the deposition chamber 14 to produce graphene at a low temperature. The substrate may be moved in sequence into the deposition chamber 14 and the ICP-CVD chamber 15 by using the load-locked chamber 13, but the present invention may not be limited thereto.

Referring to FIGS. 1 and 2, the producing method of graphene in accordance with an illustrative embodiment comprises a step (S1) of loading a substrate 21 into the deposition chamber 14 to selectively form a metal catalyst layer 22 for growing graphene on the substrate 21, and a step (S2) of loading the substrate 21 itself or the substrate 21 on which the metal catalyst layer 22 for growing graphene is formed into the ICP-CVD chamber 15 and supplying a carbon source 24 to produce graphene 23 at a low temperature by the ICP-CVD. The substrate may be moved in sequence into the deposition chamber 14 and the ICP-CVD chamber 15 by using the load-locked chamber 13, but the present invention may not be limited thereto.

FIG. 3 provides schematic diagrams illustrating the graphene producing method by a roll-to-roll process in accordance with an illustrative embodiment.

Referring to FIG. 3, the producing method of graphene in accordance with an illustrative embodiment may be carried out by, but may not be limited to, a roll-to-roll process. By way of example, by the roll-to-roll process, the substrate may be loaded into a deposition chamber and a metal catalyst layer for growing graphene may be formed on the substrate. The substrate on which the metal catalyst layer for growing graphene is formed may be loaded into an ICP-CVD chamber by the roll-to-roll process and a carbon source may be supplied to produce graphene at a low temperature by ICP-CVD.

The metal catalyst layer for growing graphene may be formed by various deposition methods publicly known in the art, such as an electron-beam deposition method, a thermal evaporation method, a sputtering method, etc. However, the substrate is loaded into the deposition chamber by using the load-locked chamber.

When the graphene is produced by the ICP-CVD, high-density plasma is generated at a low pressure and a graphene layer is formed. There will be schematically explained a graphene layer forming method using an ICP-CVD apparatus. By using a typical ICP-CVD apparatus, a substrate on which the metal catalyst layer for growing graphene is formed is loaded into the ICP-CVD apparatus by using the load-locked chamber. While a chamber of the ICP-CVD apparatus into which the substrate is loaded is maintained at a vacuum level of, for example, from about 5 mTorr to about 100 mTorr, the carbon source-containing gas is supplied into the chamber. Plasma is generated within the chamber with an induced magnetic field generated by applying a high frequency power of about several hundred kHz to about several hundred MHz. Thus, graphene can be produced on the metal catalyst layer for growing graphene produced on the substrate loaded into the chamber by a reaction with the carbon source-containing gas. During the ICP-CVD, it is important to generate uniform plasma by uniformly spraying the carbon source-containing gas to the entire metal catalyst layer for growing graphene on the substrate, and the graphene can be produced while a temperature of the substrate is maintained at about 500° C. or less.

By using the load-locked chamber, it is possible to avoid a contact with oxygen before the graphene is produced. Therefore, even if a metal catalyst layer for growing graphene apt to be oxidized is used, the graphene producing method can be carried out without worrying about oxidization.

During the ICP-CVD for depositing graphene, a production amount of graphene can be adjusted by maintaining the ICP-CVD for a predetermined time at a certain temperature. That is, if the ICP-CVD is maintained for a long time, a large amount of graphene can be produced. As a result, a thickness of a graphene sheet can be increased. If the ICP-CVD is performed for a short time, a thickness of a graphene sheet can be decreased. Therefore, in addition to a kind of the carbon source, a supplied pressure, a kind of the catalyst for growing graphene, a size of the chamber, a maintenance time of the ICP-CVD is an important factor in obtaining a target thickness of the graphene sheet. Desirably, the maintenance time of the ICP-CVD may be in a range of, for example, from about 0.0003 hours to about 1 hour. If the maintenance time is less than about 0.0003 hours, graphene cannot be obtained sufficiently. If the maintenance time is more than about 1 hour, graphene may be produced too much and may be graphited.

After the ICP-CVD, a cooling process is performed on the produced graphene. The cooling process is provided to uniformly grow and arrange the produced graphene. Rapid cooling may cause cracks in a produced graphene sheet, and, thus, it is desirable to perform gradual cooling at a constant speed if possible. By way of example, the cooling process may be performed at a speed of about 10° C. or less per minute or natural cooling may be performed. The natural cooling is performed by just removing a heat source used for a heating process. A sufficient cooling speed can be obtained by just removing the heat source.

The graphene sheet obtained after the cooling process may have a thickness corresponding to about a single layer to about 300 layers, for example, about a single layer to about 60 layers, about a single layer to about 30 layers, about a single layer to about 20 layers, or about a single layer to about 10 layers, of graphene.

The above-described ICP-CVD and cooling process may be performed in one cycle, or these processes may be performed many times to produce a graphene sheet having many layers and a dense structure.

In accordance with an illustrative embodiment, the substrate may have, but may not be limited to, transparency or flexibility, or transparency and flexibility.

In accordance with an illustrative embodiment, the substrate may include, but may not be limited to, metal foil, a glass substrate or a polymer sheet. By way of example, if the substrate is metal foil, the metal foil may include, but may not limited to, one selected from the group consisting of Ni, Co, Fe, Pt, Au, Al, Cr, Cu, Mg, Mn, Rh, Si, Ta, Ti, W, U, V, Zr, Fe, brass, bronze, stainless steel, Ge, and combinations thereof which can serve as the metal catalyst layer for growing graphene. Therefore, if the substrate is metal foil, there is no need to form a metal catalyst layer for growing graphene on the substrate and graphene can be produced directly on the substrate. By way of example, the metal foil may include, but may not be limited to, aluminum foil, zinc foil, copper foil or nickel foil. If the aluminum foil, zinc foil, copper foil or the nickel foil is used as the substrate and graphene is grown thereon, the foil is used not as a general substrate but as a substrate for growing graphene. Thus, the foil is not loaded into a deposition chamber but loaded directly into an ICP-CVD chamber through a load-locked chamber to grow graphene thereon.

In accordance with an illustrative embodiment, the substrate may be, but may not be limited to, a polymer sheet containing a polymer compound having π-electrons or may include, but may not be limited to, the polymer sheet. By way of example, the polymer sheet may include, but may not be limited to, one selected from the group consisting of polyacrylate, polyethylene terephthalate, polyethylene phthalate, polyethylenenaphthalate, polybuthylene phthalate, polycarbonate, polystyrene, polyether imide, polyether sulfone, polydimethyl siloxane (PDMS), polyimide, and combinations thereof. By way of example, if the substrate is a polymer sheet containing a polymer compound having π-electrons or includes the polymer sheet, graphene may be grown directly on the substrate or a metal catalyst layer for growing graphene may be further formed on the substrate, but the present invention may not be limited thereto.

In accordance with an illustrative embodiment, the carbon source may include, but may not be limited to, a carbon-containing compound having a carbon number of about 1 to about 10. By way of example, the carbon source may include, but may not be limited to, a compound selected from the group consisting of carbon monoxide, carbon dioxide, methane, ethane, ethylene, ethanol, acetylene, propane, propylene, butane, butylene, butadiene, pentane, pentene, pentyne, pentadiene, cyclopentane, cyclopentadiene, hexane, hexene, cyclohexane, cyclohexadiene, benzene, toluene, and combinations thereof.

It is desirable to supply the carbon source-containing gas into the ICP-CVD chamber into which the substrate or the substrate on which the metal catalyst layer for growing graphene is formed at a constant pressure. The carbon source-containing gas within the chamber may include only the carbon source or together with an inert gas such as helium, argon, etc. Further, the carbon source-containing gas may include hydrogen in addition to the carbon source. The hydrogen can be used to control a gas phase reaction by keeping a surface of the metal catalyst layer clean. The hydrogen may account for about 1 volume % to about 40 volume %, desirably about 10 volume % to about 30 volume %, and more desirably about 15 volume % to about 25 volume % of the overall volume of the chamber.

In accordance with an illustrative embodiment, the metal catalyst layer for growing graphene may be a thin film or a thick film. By way of example, if it is a thin film, a thickness thereof may be in a range of, but may not be limited to, from about 1 nm to about 1000 nm, or from about 1 nm to about 500 nm, or from about 1 nm to about 300 nm. If it is a thick film, a thickness thereof may be in a range of, but may not be limited to, from about 1 mm to about 5 mm. By way of example, the metal catalyst layer for growing graphene is thick, thick graphite crystals may be formed. Therefore, it is important to adjust a thickness of the metal catalyst layer for growing graphene. Desirably, a thickness of the metal catalyst layer for growing graphene may be in a range of from about 1 nm to about 1000 nm, or from about 1 nm to about 500 nm, or from about 1 nm to about 300 nm.

When the metal catalyst layer for growing graphene is in contact with the carbon source, the metal catalyst layer for growing graphene helps carbon components contained in the carbon source to be combined with each other to form a hexagonal plate structure. By way of example, the metal catalyst layer for growing graphene may include, but may not be limited to, one selected from the group consisting of Ni, Co, Fe, Pt, Au, Al, Cr, Cu, Mg, Mn, Rh, Si, Ta, Ti, W, U, V, Zr, Fe, brass, bronze, stainless steel, Ge, and combinations thereof.

In accordance with an illustrative embodiment, the producing method of graphene may further comprise, but may not be limited to, cooling the produced graphene.

In accordance with an illustrative embodiment, the producing method of graphene may comprise, but may not be limited to, separating the produced graphene in a sheet form from the substrate by etching and removing the metal catalyst layer for growing graphene after the graphene is produced. By way of example, the metal catalyst layer for growing graphene may be etched and removed in an etching solution including, but may not be limited to, an acid, FeCl$_3$ or combinations thereof. The metal catalyst layer for growing graphene may be etched and removed through a roll-to-roll process. If necessary, after the etching process, a cleaning process may be further performed, and the cleaning process may be performed through a roll-to-roll process.

The graphene sheet obtained from the above-described process can be formed by bringing the substrate or the substrate on which the metal catalyst layer for growing graphene is formed into contact with the carbon source to perform the ICP-CVD at a low temperature and cooling it without any complicated process. Therefore, the process is simple and economical. It is possible to readily form a graphene sheet of a large area of about 1 mm or more wide and long, or about 1 cm or more wide and long, or about 1 cm to about 1 m wide and long. By way of example, by freely adjusting a size of the substrate on which the metal catalyst layer for growing graphene is formed, it is possible to obtain a graphene sheet of a large area. Since the carbon source is supplied in a gaseous phase, a shape of the substrate is not limited. Therefore, a graphene sheet having various shapes such as a circle, a quadrangle, and a polygon can be obtained. In this case, the transversal and longitudinal lengths of the substrate can be measured by selecting an appropriate position depending on a shape of the graphene sheet. In particular, in case of a circular graphene sheet, the transversal and longitudinal lengths may be the diameter of the graphene sheet. The substrate may have a three-dimensional solid shape. Further, since a shape of the metal catalyst layer for growing graphene is not limited, the substrate may have various particle shapes.

In accordance with an illustrative embodiment, the graphene producing method may include, but may not be limited to, controlling a thickness of the produced graphene by adjusting a reaction time of the ICP-CVD.

In accordance with an illustrative embodiment, the graphene producing method may include, but may not be limited to, further supplying the carbon source-containing gas and a reduction gas. By way of example, the reduction gas may include, but may not be limited to, hydrogen, helium, argon or nitrogen.

In accordance with an illustrative embodiment, the metal catalyst layer for growing graphene may be patterned, but the present invention may not be limited thereto.

The graphene obtained as described above can be checked from a Raman spectrum. That is, pure graphene shows a G' peak at about 1594 cm$^{-1}$ in a Raman spectrum. Therefore, formation of graphene can be checked from existence of such a peak.

Graphene in accordance with the present invention is obtained from a pure material in a gaseous phase through the ICP-CVD at a low temperature. A D-band in a Raman spectrum means whether or not there is a defect in the graphene. When a peak intensity of the D-band is high, it is deemed that many defects exist in the graphene. When a peak intensity of the D-band is low or there is no D-band, it is deemed that defects scarcely exist in the graphene.

The separated graphene sheet can be modified in various ways depending on an intended use. That is, the graphene sheet may can be cut into a specific shape or rolled in a specific direction to form a tube shape. The modified graphene sheet can be transferred onto or combined with a target object.

The graphene sheet may have various uses. The graphene sheet may be used as a transparent electrode due to its high conductivity and high film uniformity. As for a solar cell, an electrode is provided on a substrate and a transparent electrode is needed for transmitting light. If the graphene sheet is used as the transparent electrode, high conductivity can be obtained. Further, since the graphene sheet is flexible, a flexible transparent electrode can be fabricated readily. That is, if the substrate is made of flexible plastic and the graphene sheet is used as a transparent electrode, a bendable solar cell can be fabricated. Furthermore, if the graphene sheet is used as a panel conductive film of various display devices, conductivity can be obtained as required with a small amount of graphene and an amount of transmitted light can be increased. Besides, if the graphene sheet is formed in a tube shape, it can be used as optical fiber and can be used as a hydrogen storage or a membrane that selectively transmits hydrogen.

In accordance with a second aspect of the present invention, there is provided a method for direct transfer of graphene comprising producing graphene on a metal catalyst layer for growing graphene produced on a substrate, and removing the metal catalyst layer for growing graphene to directly transfer the produced graphene onto the substrate.

Figure 3A:
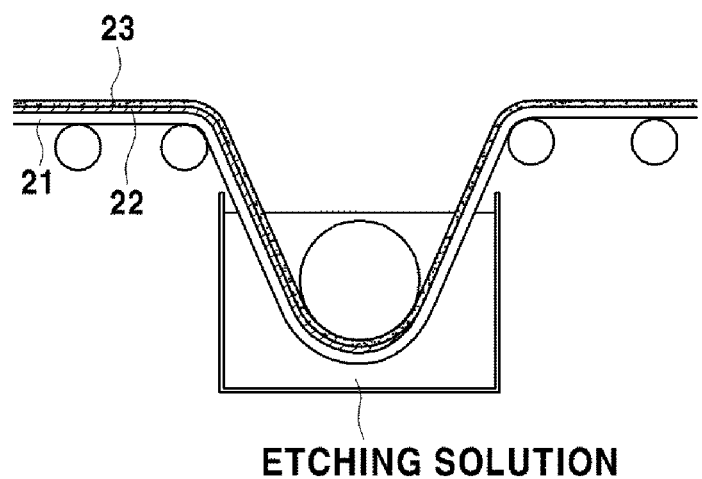
FIGS. 3A and 3B illustrate a method for producing graphene and a method for transfer of graphene by using a roll-to-roll process in accordance with an illustrative embodiment of the present invention.
Figure 3B:
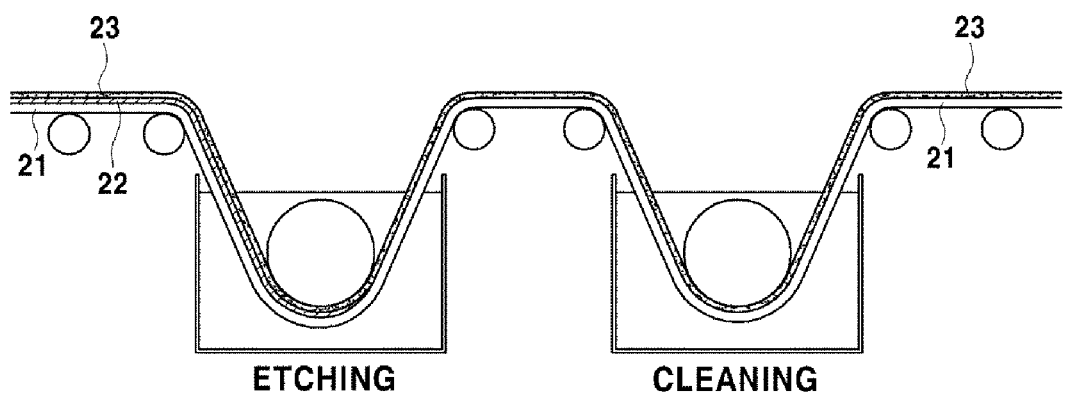

In accordance with an illustrative embodiment, the metal catalyst layer for growing graphene may be removed through an etching process using an etching solution including, but may not be limited to, an acid, a salt, FeCl$_3$ or combinations thereof. The metal catalyst layer for growing graphene may be etched and removed by a roll-to-roll process (FIG. 3A). If necessary, after the etching process, a cleaning process may be further performed, and the cleaning process may be carried out by a roll-to-roll process (FIG. 3B).

In accordance with an illustrative embodiment, the produced graphene may be directly transferred onto the substrate through a roll-to-roll process.

In accordance with an illustrative embodiment, the graphene may be produced, but may not be limited to, at a low temperature of about 500° C. or less by ICP-CVD of the method in accordance with the first aspect of the present invention. All the above descriptions about the graphene producing method in accordance with the first aspect of the present invention can be applied to the method for producing graphene in accordance with the second aspect of the present invention, and redundant descriptions will be omitted for convenience sake.

The method for direct transfer of graphene in accordance with an illustrative embodiment may be carried out by including the process illustrated in FIG. 2.

Referring to FIG. 2, the method for direct transfer of graphene in accordance with an illustrative embodiment may include, but may not be limited to, a step (S3) of supplying the carbon source-containing gas 24 to the metal catalyst layer 22 for growing graphene produced on the substrate 21 to produce the graphene 23 at a low temperature of about 500° C. or less by the ICP-CVD, and a step (S4) of removing the metal catalyst layer 22 for growing graphene to directly transfer the produced graphene onto the substrate. All the descriptions about the producing method of graphene can be applied to the method for direct transfer of graphene.

In accordance with an illustrative embodiment, producing graphene on the metal catalyst layer for growing graphene produced on the substrate and removing the metal catalyst layer for growing graphene to directly transfer the produced graphene onto the substrate may be carried out by, but may not be limited to, a roll-to-roll process as depicted in FIG. 3.

Referring to FIG. 3, the metal catalyst layer for growing graphene can be etched and removed by a roll-to-roll process (FIG. 3A). If necessary, after the etching process, a cleaning process may be further performed, and the cleaning process may be carried out by a roll-to-roll process (FIG. 3B).

In accordance with an illustrative embodiment, the metal catalyst layer for growing graphene may be removed through an etching process using an etching solution including, but may not be limited to, an acid, a salt, $FeCl_3$ or combinations thereof.

In accordance with an illustrative embodiment, the metal catalyst layer for growing graphene may include, but may not be limited to, one selected from the group consisting of Ni, Co, Fe, Pt, Au, Al, Cr, Cu, Mg, Mn, Rh, Si, Ta, Ti, W, U, V, Zr, Fe, brass, bronze, stainless steel, Ge, and combinations thereof.

The graphene producing process may include all the descriptions about the graphene sheet forming method, and redundant descriptions thereof will be omitted for convenience sake.

In accordance with an illustrative embodiment, the substrate may be, but may not be limited to, a polymer sheet containing a polymer compound having π-electrons or may include, but may not be limited to, the polymer sheet. By way of example, the polymer sheet may include, but may not be limited to, one selected from the group consisting of polyacrylate, polyethylene etherphthalate, polyethylene phthalate, polyethylenenaphthalate, polybuthylene phthalate, polycarbonate, polystyrene, polyether imide, polyether sulfone, polydimethyl siloxane (PDMS), polyimide, and combinations thereof.

When the metal catalyst layer for growing graphene is etched and removed, the graphene may be bonded to the polymer sheet by an attractive force (for example, van der Waals force, etc.) between $sp^2$ electrons of the graphene and π-electrons existing on a surface of the polymer sheet so as to be directly transferred onto the polymer sheet. Thus, graphene can be synthesized and directly transferred onto a polymer sheet or a substrate including the polymer sheet without an additional transfer process. By way of example, the substrate including the polymer sheet may include, but may not be limited to, a transparent substrate such as glass on which a polymer sheet is formed.

In accordance with a third aspect of the present invention, there is provided a graphene sheet comprising a substrate, and graphene produced on the substrate.

In accordance with an illustrative embodiment, the graphene may be produced by, but may not be limited to, the method in accordance with the first aspect of the present invention.

In accordance with an illustrative embodiment, the graphene may be produced by, but may not be limited to, supplying a carbon source-containing gas to the substrate or a metal catalyst layer for growing graphene produced on the substrate and performing ICP-CVD at a low temperature of about 500° C. or less.

In accordance with an illustrative embodiment, the graphene sheet may be formed by, but may not be limited to, transferring, onto a target substrate, graphene produced by supplying a carbon source-containing gas to a separate substrate or a metal catalyst layer for growing graphene produced on the separate substrate and performing ICP-CVD at a low temperature of about 500° C. or less. As the transfer method, a wet transfer method or a dry transfer method publicly known in the art may be used.

In accordance with an illustrative embodiment, the graphene sheet may be formed by, but may not be limited to, the method for direct transfer of graphene in accordance with the second aspect of the present invention.

In accordance with an illustrative embodiment, the graphene sheet may be produced through, but may not be limited to, a process including supplying a carbon source-containing gas to a metal catalyst layer for growing graphene formed on the substrate, producing graphene at a low temperature of about 500° C. or less by ICP-CVD, and removing the metal catalyst layer for growing graphene to directly transfer the produced graphene on the substrate.

All the descriptions about the producing method of graphene in accordance with the first aspect of the present invention and the method for direct transfer of graphene in accordance with the second aspect of the present invention may be included in the third aspect of the present invention, and redundant descriptions thereof will be omitted for convenience sake.

In accordance with an illustrative embodiment, the graphene sheet may be doped with a dopant including, but may not be limited to, an organic dopant, an inorganic dopant or a combination thereof.

In accordance with an illustrative embodiment, the dopant may include, but is not limited to, one or more selected from the group consisting of $NO_2BF_4$, $NOBF_4$, $NO_2SbF_6$, HCl, $H_3PO_4$, $H_2CCOOH$, $H_2SO_4$, $HNO_3$, PVDF, nafion, $AuCl_3$, $HAuCl_4$, $SOCl_2$, $Br_2$, dichloro dicyano quinone, oxone, dimyristoyl phosphatidylinositol, and trifluoromethanesulfonimide.

In accordance with an illustrative embodiment, the substrate may have, but may not be limited to, transparency or flexibility, or transparency and flexibility.

In accordance with an illustrative embodiment, the substrate may include, but may not be limited to, metal foil, a glass substrate or a polymer sheet.

In accordance with an illustrative embodiment, the substrate may be, but may not be limited to, a polymer sheet containing a polymer compound having π-electrons or may include, but may not be limited to, the polymer sheet. By way of example, the polymer sheet may include, but may not be limited to, one selected from the group consisting of polyacrylate, polyethylene etherphthalate, polyethylene phthalate, polyethylenenaphthalate, polybuthylene phthalate, polycarbonate, polystyrene, polyether imide, polyether sulfone, polydimethyl siloxane (PDMS), polyimide, and combinations thereof.

In accordance with an illustrative embodiment, a thickness of the graphene sheet may have, but may not be limited to, about a single layer to about 300 layers.

In accordance with an illustrative embodiment, a transversal and longitudinal length the graphene sheet may be, but may not be limited to, about 1 mm to about 1 m.

In accordance with an illustrative embodiment, the metal catalyst layer for growing graphene may be a thin film or a thick film. By way of example, if it is a thin film, a thickness thereof may be in a range of, but may not be limited to, from about 1 nm to about 1000 nm, or from about 1 nm to about 500 nm, or from about 1 nm to about 300 nm. If it is a thick film, a thickness thereof may be in a range of, but may not be limited to, from about 1 mm to about 5 mm.

In accordance with an illustrative embodiment, the metal catalyst layer for growing graphene may include, but may not be limited to, one selected from the group consisting of Ni, Co, Fe, Pt, Au, Al, Cr, Cu, Mg, Mn, Rh, Si, Ta, Ti, W, U, V, Zr, Fe, brass, bronze, stainless steel, Ge, and combinations thereof.

Hereinafter, the present invention will be explained in detail with reference to examples. However, the present invention is not limited thereto.

Example 1

Low-Temperature Growth and Transfer of Graphene onto Polyimide (PI) Polymer Sheet Substrate Graphene was produced and directly transferred onto a polyimide (PI) polymer sheet substrate by using an apparatus illustrated in FIG. 1 through a process illustrated in FIG. 2. To be specific, the polyimide (PI) polymer sheet substrate was loaded into a deposition chamber by using a load-locked chamber and a Ni layer and a Cu layer patterned in various ways as metal catalyst layers for growing graphene were respectively deposited with a thickness of about 150 nm by a RF sputtering method. Then, the substrate on which the catalyst layers were deposited was unloaded from the deposition chamber to the load-locked chamber and loaded into an ICP-CVD chamber. The substrate was annealed at a temperature of about 300° C. with a hydrogen gas. Thereafter, a carbon and argon-containing gas ($C_2H_2$:Ar=60:2 sccm) was supplied thereto at about 20 mTorr for about 15 seconds to about 3 minutes to produce graphene on each of the Ni layer and the Cu layer by means of ICP-CVD. Then, the graphene was cooled at a speed of about 5° C./s at room temperature within the ICP-CVD chamber, so that a graphene sheet grown on each of the Ni layer and the Cu layer was obtained. The patterned Ni layer and Cu layer were etched and removed by using a $FeCl_3$ solution and the graphene sheet was directly transferred onto the PI substrate. The graphene with a pattern shape of the patterned Ni layer and Cu layer was directly transferred onto the PI substrate.

Figure 4:
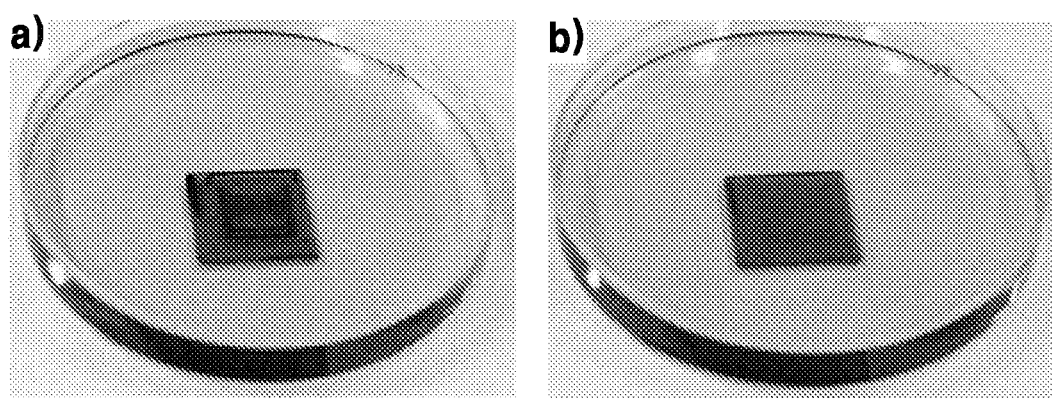
FIG. 4 provides photographs of graphene grown on a patterned nickel thin film (a) before and (b) after the graphene is etched in accordance with an example of the present invention.
Figure 5:
FIG. 5 provides a photograph for comparing transparency between a PI substrate (left) on which graphene is formed and a PI substrate (right) on which a graphene sheet is not yet formed in accordance with an example of the present invention.
Figure 6:
FIG. 6 provides a photograph showing a process for measuring and checking conductivity of graphene directly transferred onto a PI substrate in accordance with an example of the present invention.

Photographs of graphene grown on the patterned nickel thin film (a) before and (b) after the graphene was etched illustrated in FIG. 4. A photograph for comparing transparency between the PI substrate (left) on which graphene was formed and the PI substrate (right) on which a graphene sheet was not yet formed illustrated in FIG. 5. A photograph showing a process for measuring and checking conductivity of graphene directly transferred onto the PI substrate illustrated in FIG. 6. Further, Changes in an electrical characteristic (change in resistance) and transmittance of the graphene sheet depending on a plasma power, a time, and a metal catalyst layer (in each case of using Ni and Cu) used for synthesizing the graphene sheet illustrated in below Table 1 (Ni film) and Table 2 (Cu film).

TABLE 1

| | Plasma power | Time | Resistance (Ω) | Transmittance (550 nm) |
|---|---|---|---|---|
| 1 | 50 W | 180 s | 26k | 78.2% |
| 2 | 50 W | 60 s | 38k | 83.2% |
| 3 | 50 W | 30 s | — | 85.2% |
| 4 | 100 W | 180 s | — | 74.9% |
| 5 | 150 W | 180 s | 26k | 79.2% |
| 6 | 200 W | 180 s | 6k | 65.4% |
| 7 | 50 W | 15 s | — | 78.9% |

TABLE 2

| | Plasma power | Time | Resistance (Ω) | Resistance (s) (Ω) | Transmittance (%) |
|---|---|---|---|---|---|
| 1 | 50 W | 180 s | 160k | 78k | 71.79 |
| 2 | 50 W | 60 s | 860k | 306k | 89.76 |
| 3 | 50 W | 15 s | 5300k | 2838k | 90.90 |
| 4 | 100 W | 180 s | 110k | 21k | 70.06 |
| 5 | 150 W | 180 s | 97k | 19k | 67.04 |

Figure 7:
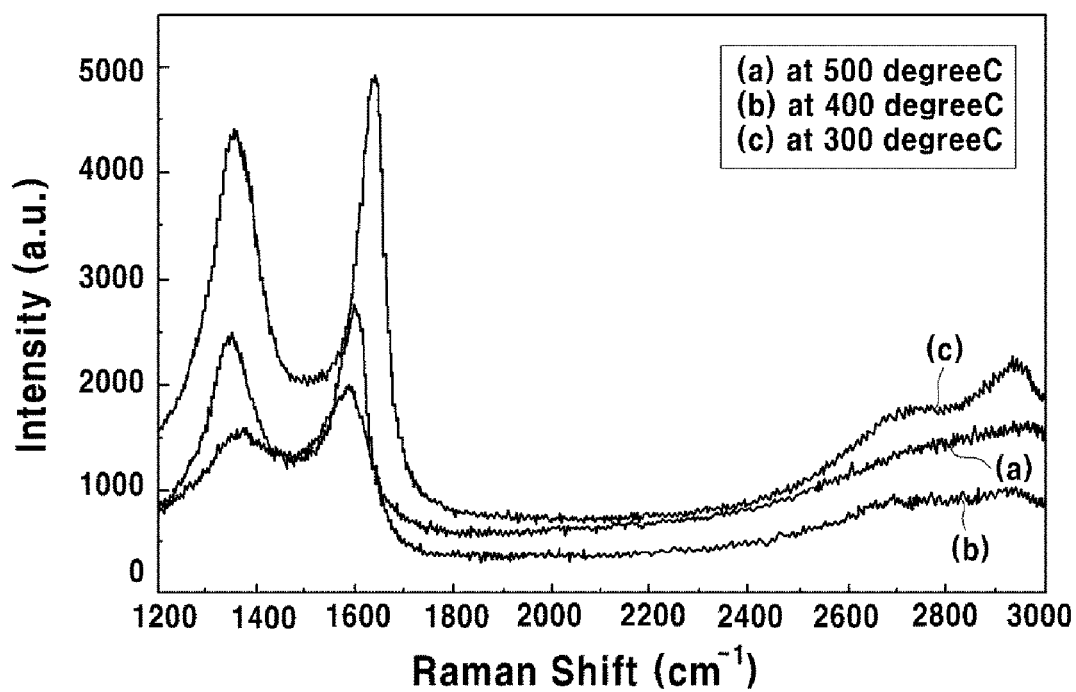
FIG. 7 is a Raman spectrum of graphene produced on a Ni film at a different temperature in accordance with an example of the present invention.
Figure 8:
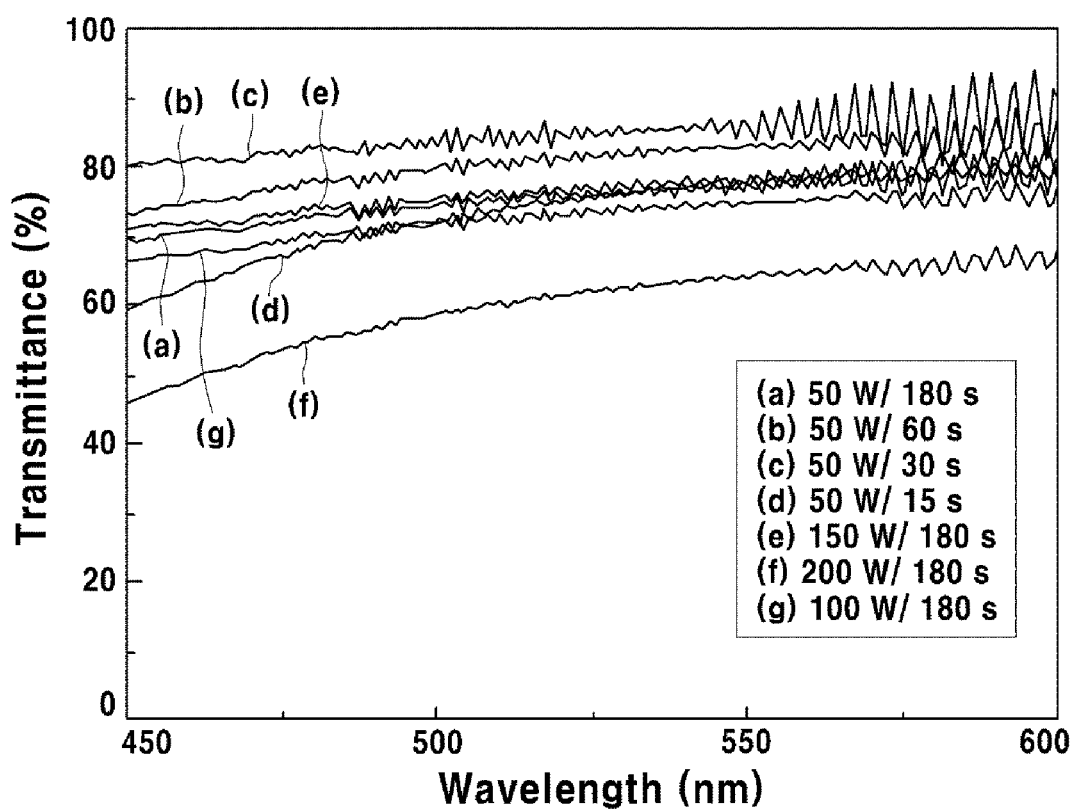
FIG. 8 is a graph showing a change in transparency of graphene produced on a Ni film depending on plasma power/time used in an example of the present invention.

FIGS. 7 and 8 are graphs illustrating a Raman spectrum of graphene produced on a Ni film at a temperature for producing graphene by ICP-CVD and a change in transparency of graphene produced on a Ni film depending on plasma power/time used. The Raman spectrum of FIG. 7 was obtained from measurement of graphene grown on a glass substrate at about 300° C., about 400° C., and about 500° C. in the same method as described above. As for the graphene grown on the PI polymer sheet substrate at about 300° C., the same Raman spectrum was obtained. It was found from the Raman spectrum that a metal catalyst layer for growing graphene was deposited on a glass substrate or a PI polymer sheet substrate and graphene could be grown at a low temperature by using an ICP-CVD apparatus. Further, it was found that transparency could be improved by adjusting a time for growing graphene.

Figure 9:
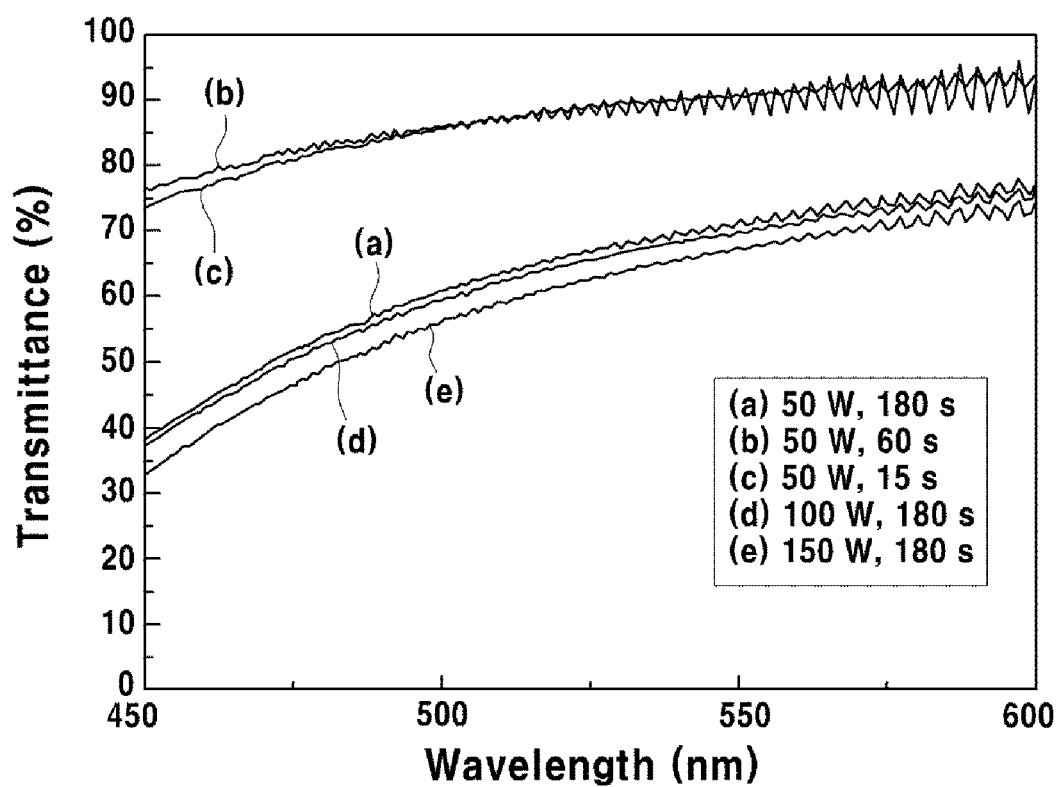
FIG. 9 is a graph showing a change in transparency of graphene produced on a Cu film depending on plasma power/time used in an example of the present invention.

FIG. 9 is a graph showing a change in transparency of graphene produced on a Cu film depending on plasma power/time used (by measuring a UV-Vis absorption spectrum).

Figure 10:
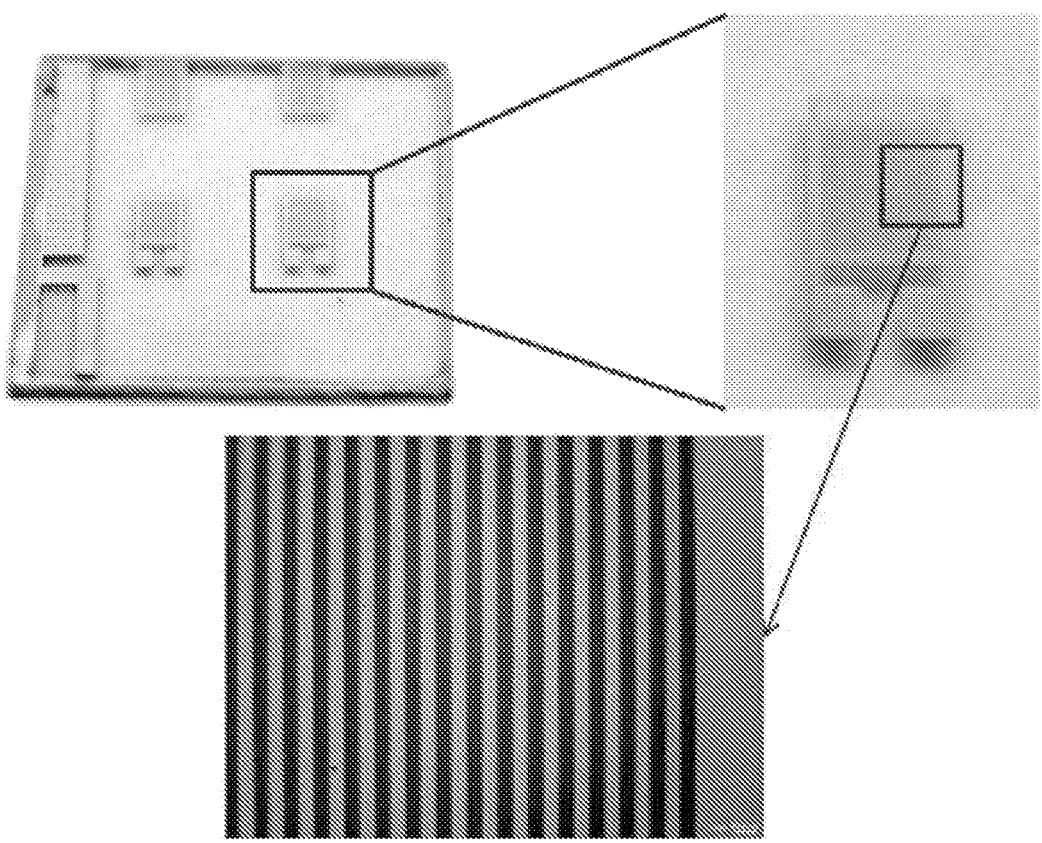
FIG. 10 provides a photograph showing graphene that is directly transferred onto a Cu film and patterned in accordance with an example of the present invention.

FIG. 10 provides a photograph from which it could be seen that graphene was directly transferred onto the patterned Cu film by the method illustrated in FIG. 2 and the graphene with a pattern shape of the of the patterned Cu film was produced thereon.

Figure 11:
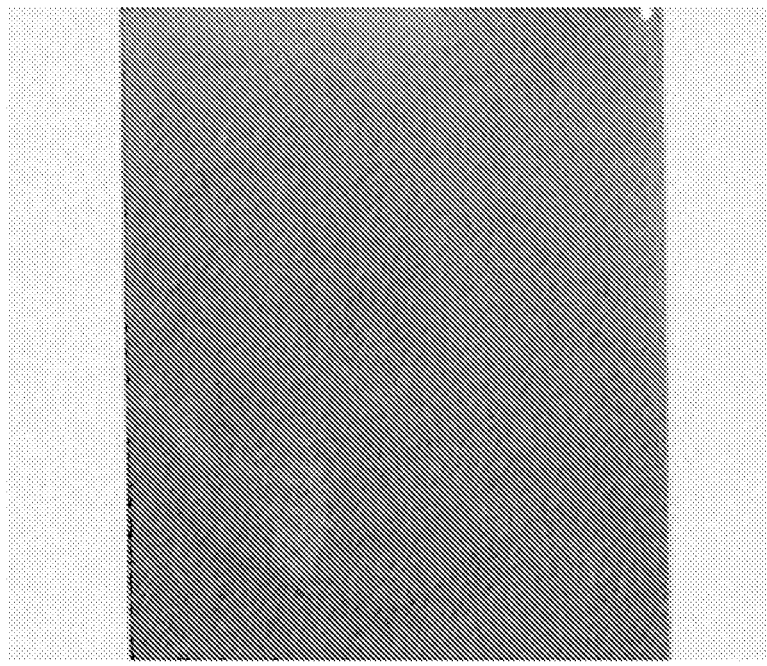
FIG. 11 provides a photograph showing a Ni film formed on a PI film in accordance with an example of the present invention.

FIG. 11 provides a photograph showing a Ni film formed on a PI film substrate. It could be seen from the photo that Ni was formed on the entire surface of the PI film substrate by using a RF sputter.

Figure 12:
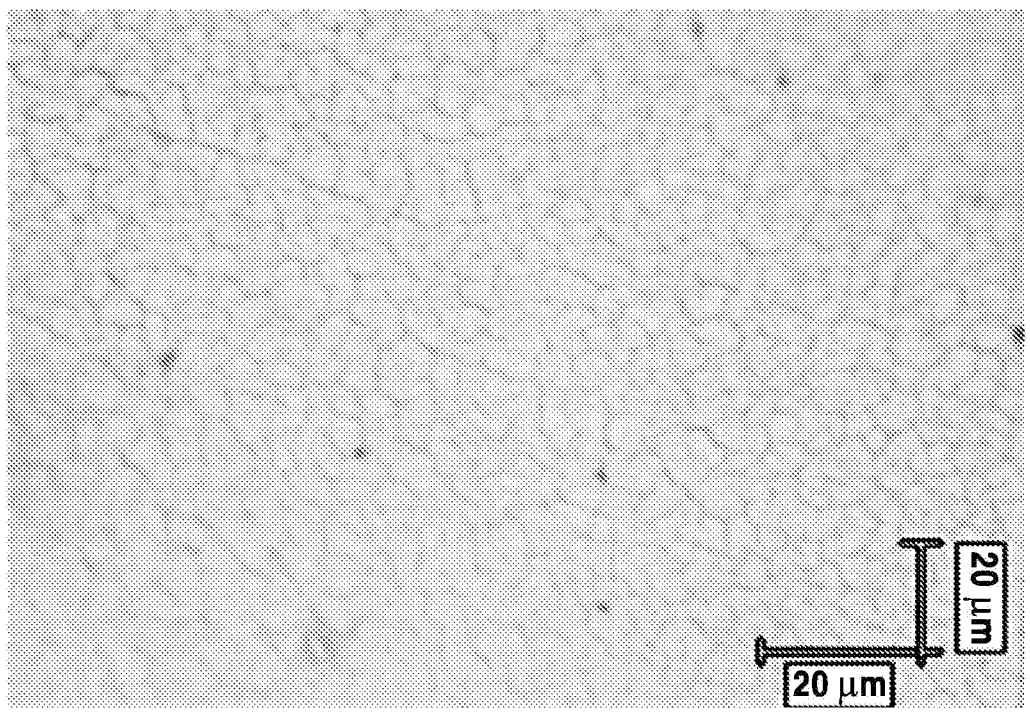
FIG. 12 provides an optical photograph of graphene produced on a Ni film and observed with a high magnification (1000 times) in accordance with an example of the present invention.

FIG. 12 provides an optical photograph of graphene produced on the Ni film deposited on the PI film of FIG. 11 and observed with a high magnification (1000 times). After an annealing process at about 300° C. with a hydrogen gas, a carbon and argon-containing gas ($C_2H_2$:Ar=60:2 sccm) was supplied at about 20 mTorr for about 15 seconds to about 3 minutes to produce graphene on the Ni film by means of ICP-CVD. Then, the graphene was cooled at a speed of about 5° C./s at room temperature within the ICP-CVD chamber, so that a graphene sheet grown on the Ni film was obtained. It could be seen that a graphene thin film having a grain size of several tens μm was produced on the Ni film.

Figure 13:
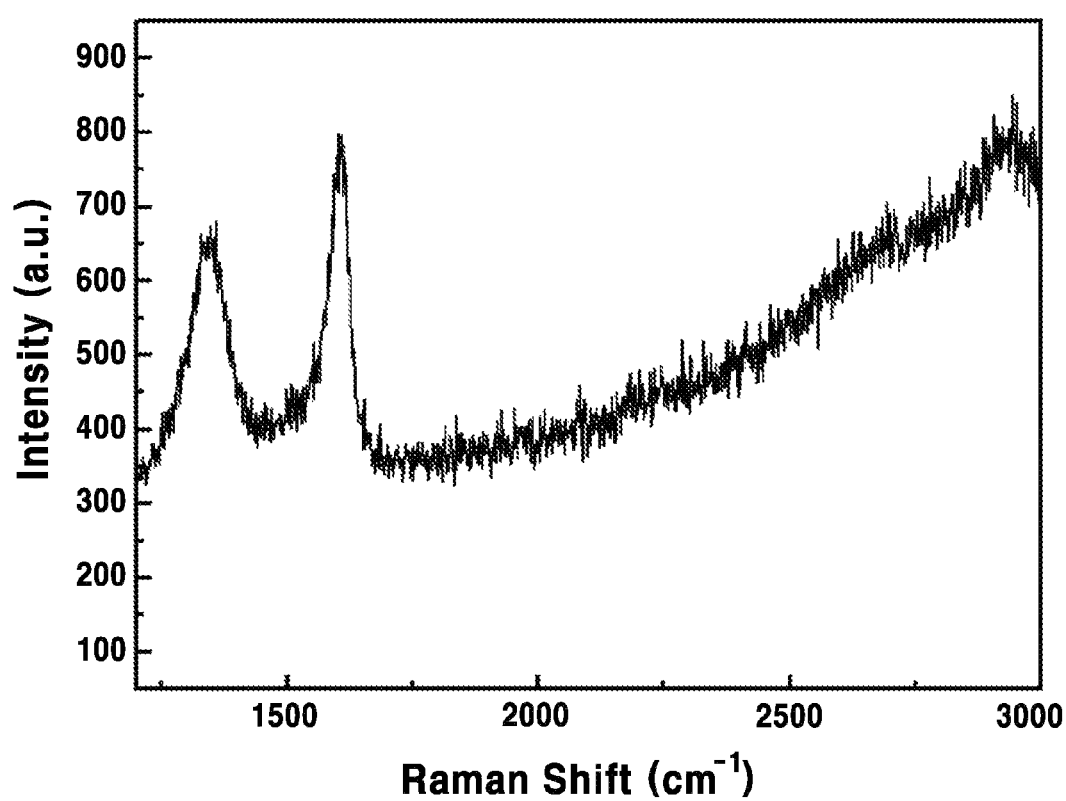
FIG. 13 is a Raman spectrum graph for checking whether there is graphene produced on a Ni film or not in accordance with an example of the present invention.

FIG. 13 is a Raman spectrum graph for checking whether graphene was produced on a Ni film or not. A photograph and a Raman spectrum of a graphene sheet obtained by transferring graphene produced on the Ni film onto a silicon wafer illustrated in FIG. 13. FIG. 13 shows a result of first and second scans of a Raman spectrum of the graphene sheet shown in FIG. 12.

Example 2

Low-Temperature Growth and Transfer of Graphene Onto Aluminum Foil Substrate

Figure 14A:
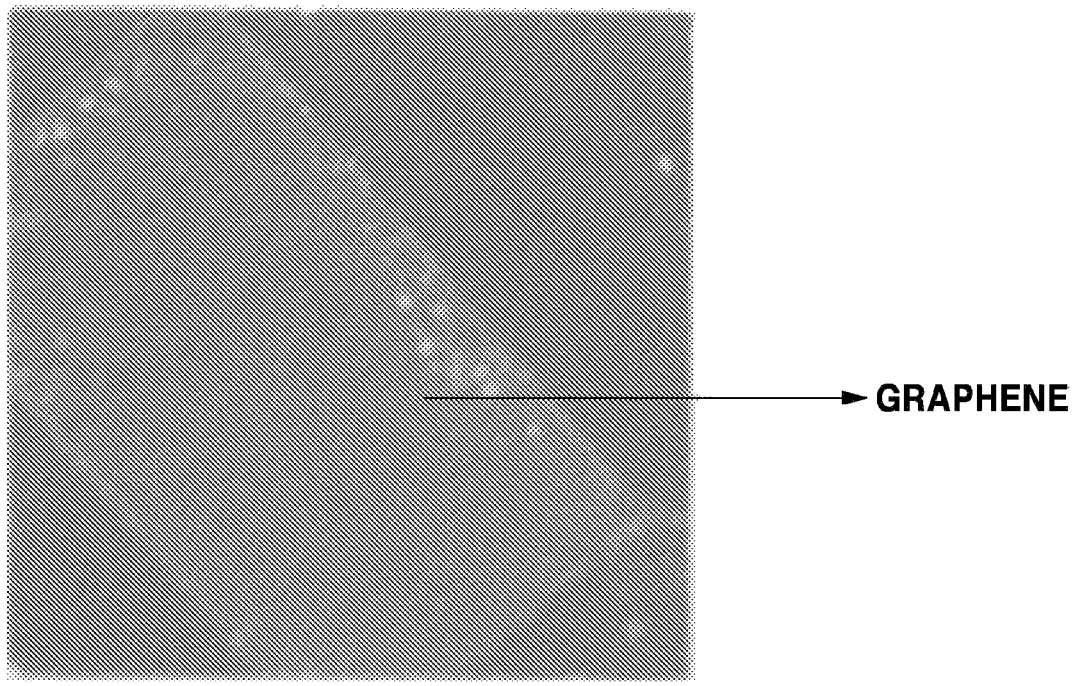
FIG. 14 provides a photograph (A) and a Raman spectrum graph (B) of a graphene sheet transferred onto a silicon wafer in accordance with an example of the present invention.
Figure 14B:
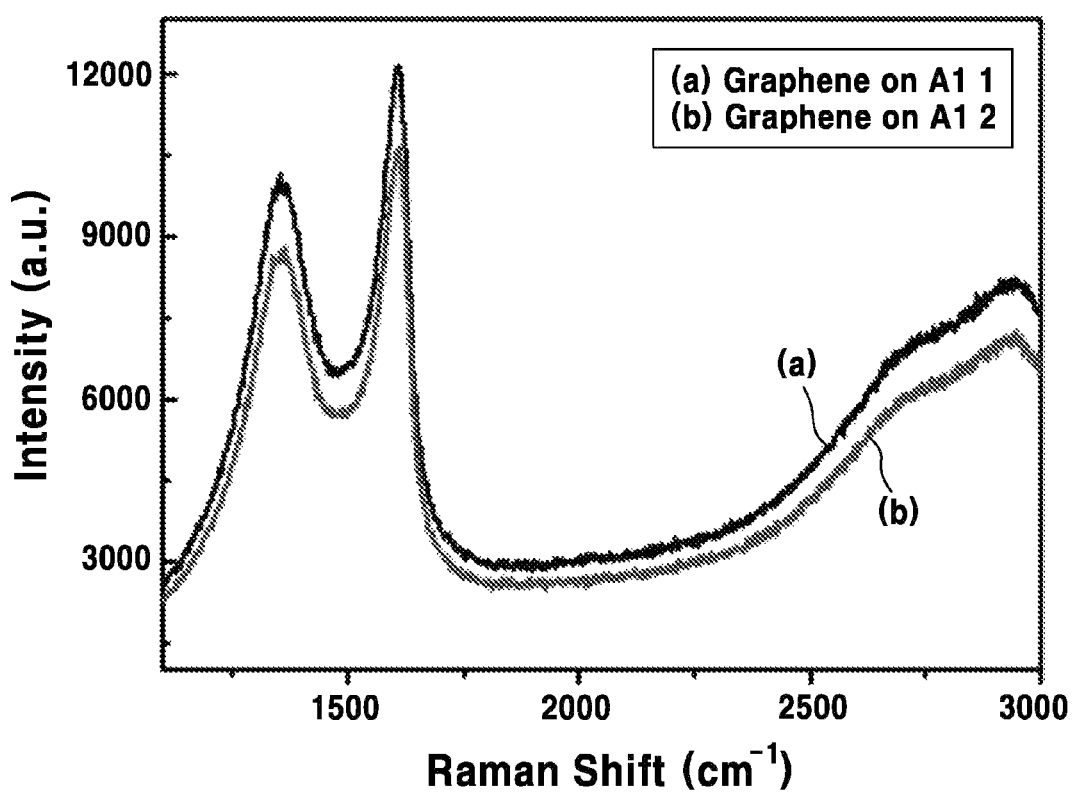

By using an apparatus illustrated in FIG. 1 and commercial aluminum foil as a substrate, a graphene sheet was grown at a low temperature and produced on the aluminum foil. To be specific, the aluminum foil substrate was loaded into an ICP-CVD chamber by using a load-locked chamber and annealed at a temperature of from about 300° C. to about 500° C. with a hydrogen gas. Thereafter, a carbon and argon-containing gas ($C_2H_2$:Ar=60:2 to 1 sccm) was supplied thereto at about 20 mTorr for about 15 seconds to about 3 minutes to produce graphene on the aluminum (Al) layer by means of ICP-CVD. Then, the graphene was cooled at a speed of about 5° C./s at room temperature within the ICP-CVD chamber, so that a graphene sheet grown on the Al layer was obtained. Thereafter, the Al layer was etched and removed by using a $FeCl_3$ solution and the separated and floated graphene sheet was transferred onto a silicon wafer. A photograph and a Raman spectrum graph of a graphene sheet transferred onto the silicon wafer illustrated in FIGS. 14A and 14B, respectively. In the Raman spectrum of FIG. 14B, Al 1 and Al 2 denote first and second scans of the Raman spectrum, respectively.

Example 3

Low-Temperature Growth and Transfer of Graphene onto Zinc Substrate

Figure 15:
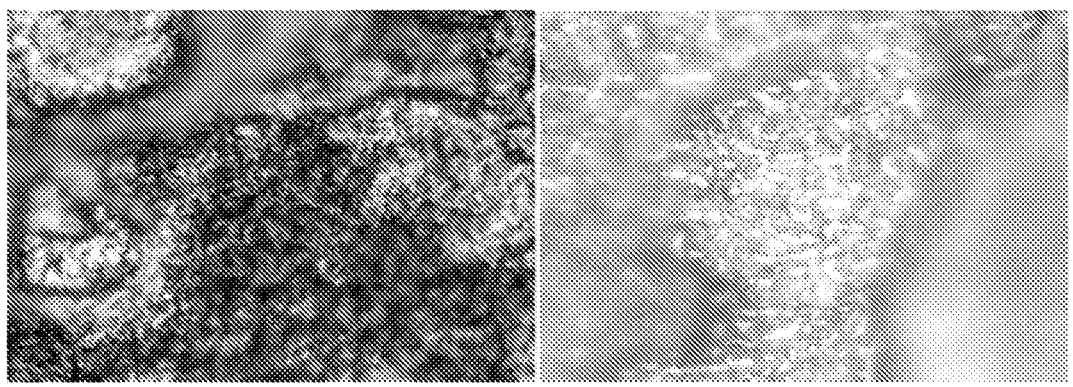
FIG. 15 provides an optical photograph of graphene deposited on a zinc substrate and observed with a high magnification (1000 times) in accordance with an example of the present invention.

By using an apparatus illustrated in FIG. 1 and commercial zinc substrate as a substrate, a graphene sheet was grown at a low temperature and produced on the zinc substrate. To be specific, the zinc substrate was loaded into an ICP-CVD chamber by using a load-locked chamber and annealed at a temperature of from about 300° C. to about 500° C. with a hydrogen gas. Thereafter, a carbon and argon-containing gas ($C_2H_2$:Ar=60:3 to 5 sccm) was supplied thereto at about 20 mTorr for about 5 minutes to about 10 minutes to produce graphene on the zinc (Zn) layer by means of ICP-CVD. Then, the graphene was cooled at a speed of about 5° C./s at room temperature within the ICP-CVD chamber, so that a graphene sheet grown on the Zn layer was obtained. A photograph and a Raman spectrum graph of a graphene sheet grown on the Zn substrate illustrated in FIGS. 15 and 16, respectively. In the Raman spectrum of FIG. 16, Al 1 and Al 2 denote fourth and fifth scans of the Raman spectrum, respectively.

Figure 16:
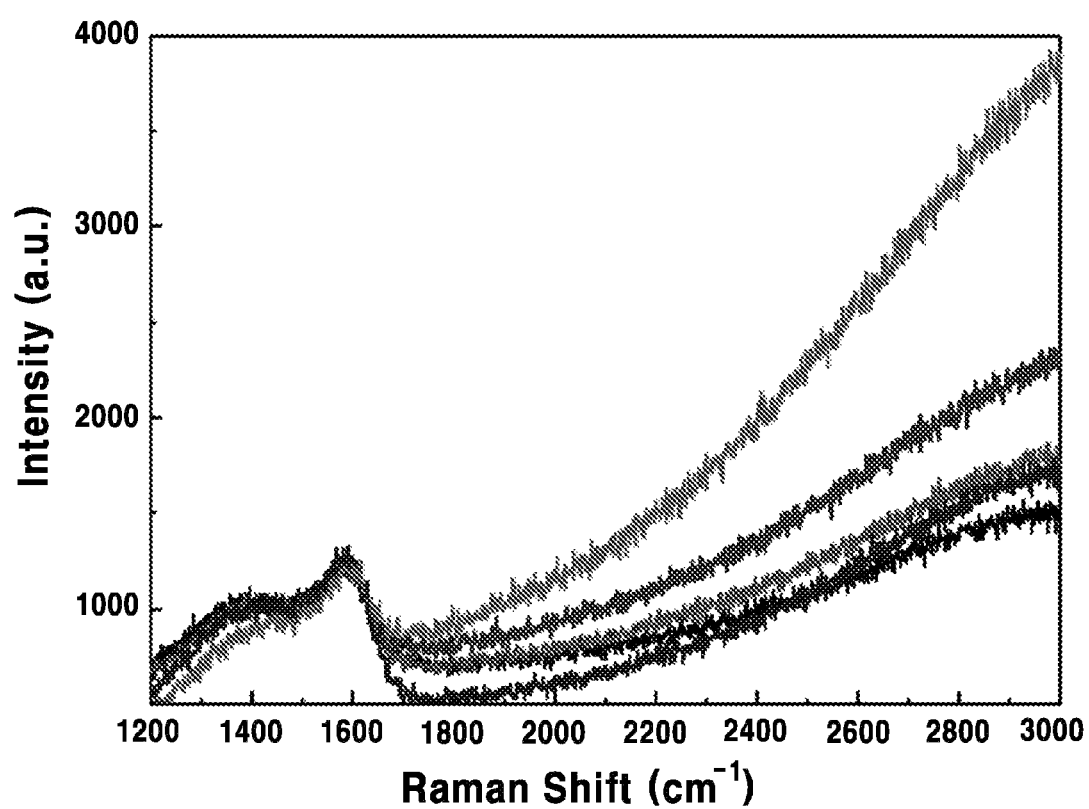
FIG. 16 is a Raman spectrum graph of a graphene sheet deposited on a zinc substrate in accordance with an example of the present invention.

The Raman spectrum of FIG. 16 relates to about graphene grown on a glass substrate at about 400° C. in the same method as described above. As for the graphene grown on the PI polymer substrate at about 300° C., the same Raman spectrum was obtained. It was found from the Raman spectrum that graphene could be grown on a zinc sheet substrate at a low temperature by using an ICP-CVD apparatus and the graphene could be used as a thermal insulating material or a thermal dissipating material.

The examples have been provided for illustration of the present invention, but the present invention is not limited thereto. It is clear to those skilled in the art that the examples can be changed and modified in various ways within the scope of the present invention.

What is claimed is:

1. A method of producing graphene comprising:
   loading a substrate into a deposition chamber using a first roll-to-roll process;
   forming a metal catalyst layer on the substrate in the deposition chamber;
   loading the substrate from the deposition chamber into an inductively coupled plasma-chemical vapor deposition (ICP-CVD) chamber using a second roll-to-roll process after the metal catalyst layer is formed on the substrate;
   supplying carbon source-containing gas to the substrate in the ICP-CVD chamber; and
   forming, within the ICP-CVD chamber, graphene on the metal catalyst layer formed on the substrate from the carbon source-containing gas, at a low temperature of 500° C. or less by inductively coupled plasma-chemical vapor deposition (ICP-CVD).

2. The producing method of claim 1, wherein the substrate is loaded in sequence from the deposition chamber into the ICP-CVD chamber by using a load-locked chamber.

3. The producing method of claim 1, wherein the substrate has transparency or flexibility, or transparency and flexibility.

4. The producing method of claim 1, wherein the substrate is a polymer sheet containing a polymer compound having $\pi$-electrons or includes the polymer sheet.

5. The producing method of claim 1, further including:
   cooling the graphene.

6. The producing method of claim 1, wherein the metal catalyst layer for growing graphene is patterned.

7. The producing method of claim 1, further including:
   separating the graphene in a sheet form from the substrate by removing the metal catalyst layer after the graphene is formed.

8. The producing method of claim 7, wherein the metal catalyst layer for growing graphene is removed through an etching process using an etching solution including an acid, a salt $FeCl_3$ or combinations thereof.

9. The producing method of claim 8, wherein the metal catalyst layer for growing graphene is removed through a roll-to-roll process.

* * * * *